US012563677B2

(12) United States Patent
Kamitsubo

(10) Patent No.: US 12,563,677 B2
(45) Date of Patent: Feb. 24, 2026

(54) MULTILAYER SUBSTRATE AND METHOD OF MANUFACTURING MULTILAYER SUBSTRATE

(71) Applicant: Murata Manufacturing Co., Ltd., Nagaokakyo (JP)

(72) Inventor: Yusuke Kamitsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1079 days.

(21) Appl. No.: 17/575,706

(22) Filed: Jan. 14, 2022

(65) Prior Publication Data

US 2022/0141965 A1 May 5, 2022

Related U.S. Application Data

(63) Continuation of application No. PCT/JP2020/029852, filed on Aug. 4, 2020.

(30) Foreign Application Priority Data

Aug. 8, 2019 (JP) ................................. 2019-146234

(51) Int. Cl.

| | |
|---|---|
| *H01F 27/28* | (2006.01) |
| *H01F 27/32* | (2006.01) |
| *H01F 41/04* | (2006.01) |
| *H01F 41/12* | (2006.01) |
| *H05K 1/02* | (2006.01) |

(Continued)

(52) U.S. Cl.

CPC ....... *H05K 3/4632* (2013.01); *H01F 27/2804* (2013.01); *H01F 27/324* (2013.01); *H01F 41/041* (2013.01); *H01F 41/125* (2013.01); *H05K 1/024* (2013.01); *H05K 1/0298*

(2013.01); *H05K 1/165* (2013.01); *H05K 3/4614* (2013.01); *H01F 2027/2809* (2013.01); *H05K 2201/0129* (2013.01); *H05K 2201/015* (2013.01);

(Continued)

(58) Field of Classification Search

CPC ......... H01F 27/2804; H01F 2027/2809; H01F 17/0013; H01F 17/0006; H01F 5/003; H05K 1/165; H05K 3/4632; H05K 2201/0129

USPC .................................................... 336/200, 232

See application file for complete search history.

(56) References Cited

U.S. PATENT DOCUMENTS

| | | | | |
|---|---|---|---|---|
| 4,639,693 | A | 1/1987 | Suzuki et al. | |
| 9,000,305 | B2* | 4/2015 | Michalk | H01Q 9/27 174/260 |

(Continued)

FOREIGN PATENT DOCUMENTS

| | | |
|---|---|---|
| JP | 62-84586 A | 4/1987 |
| JP | 02-47607 Y2 | 12/1990 |

(Continued)

OTHER PUBLICATIONS

Official Communication issued in International Patent Application No. PCT/JP2020/029852, mailed on Nov. 2, 2020.

*Primary Examiner* — Tszfung J Chan

(74) *Attorney, Agent, or Firm* — Keating & Bennett, LLP

(57) ABSTRACT

A multilayer substrate includes insulating base materials stacked in a stacking direction, at least one conductor pattern on at least one of the insulating base materials, the at least one conductor pattern including two opposite major surfaces, and insulating protective films on both of the two opposite major surfaces of the at least one conductor pattern.

10 Claims, 18 Drawing Sheets

<u>104</u>

(51) Int. Cl.
  H05K 1/16         (2006.01)
  H05K 3/46         (2006.01)

(52) U.S. Cl.
  CPC ................ *H05K 2201/0175* (2013.01); *H05K 2201/0358* (2013.01)

(56)                References Cited

U.S. PATENT DOCUMENTS

| | | | |
|---|---|---|---|
| 2017/0140866 A1 * | 5/2017 | Hong ...................... | H01F 41/10 |
| 2017/0294258 A1 * | 10/2017 | Kezuka .............. | H01F 17/0013 |
| 2019/0228900 A1 | 7/2019 | Iida | |

FOREIGN PATENT DOCUMENTS

| | | | | |
|---|---|---|---|---|
| JP | 06-243753 A | | 9/1994 | |
| JP | 2003304047 A | * | 10/2003 | |
| WO | WO-2017199826 A1 | * | 11/2017 | ......... H01F 27/2804 |
| WO | WO-2018034161 A1 | * | 2/2018 | ............ C09K 19/38 |
| WO | WO-2018034162 A1 | * | 2/2018 | ............ B32B 15/04 |
| WO | WO-2018074139 A1 | * | 4/2018 | ......... H01F 17/0013 |

* cited by examiner

101

102A

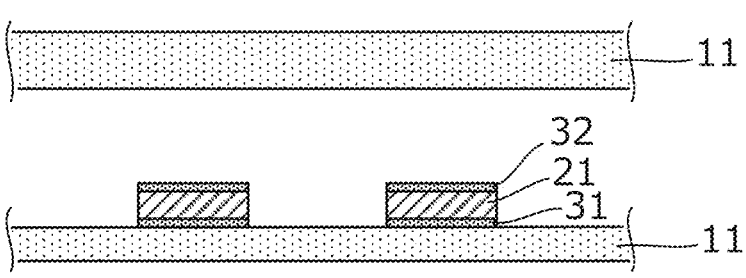
32
21
31
11
11
FIG.5A
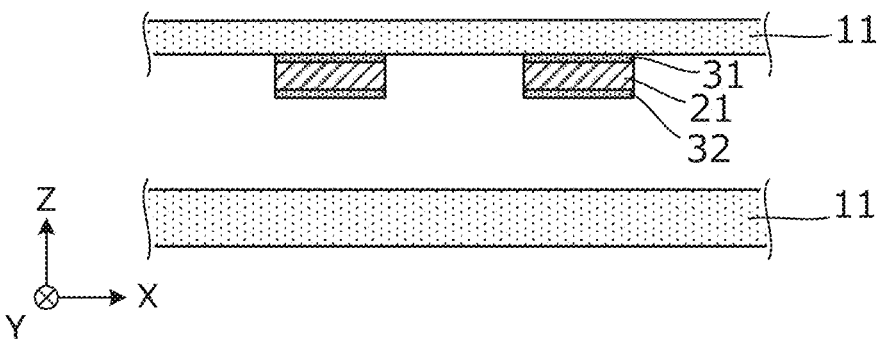
11
31
21
32
11
Z
Y ⊗ → X
102B
FIG.5B     10
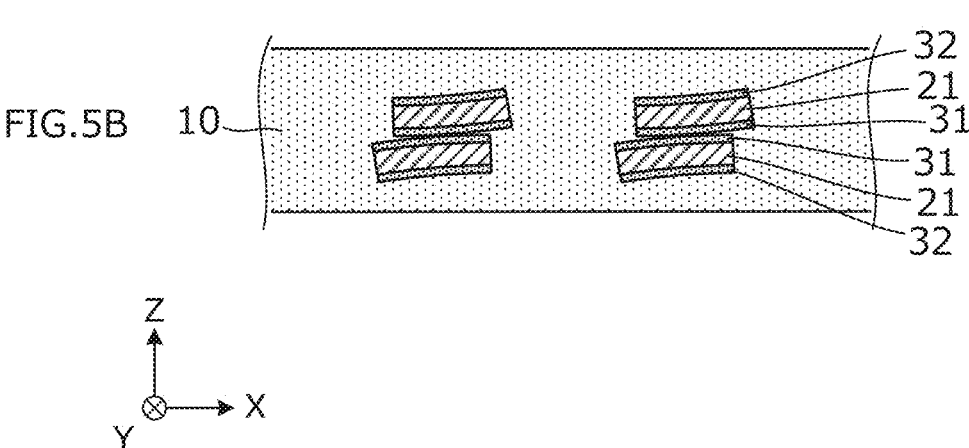
32
21
31
31
21
32
Z
Y ⊗ → X <u>103</u>

21F
31F
11

21
31
11

32F
21
31
11

21F
31F
11

21
31F
11

105B

〈COMPARATIVE EXAMPLE〉

〈COMPARATIVE EXAMPLE〉

101A

101B 32c
21c
31c
31d
21d
32d

10

MULTILAYER SUBSTRATE AND METHOD OF MANUFACTURING MULTILAYER SUBSTRATE

CROSS REFERENCE TO RELATED APPLICATIONS

This application claims the benefit of priority to Japanese Patent Application No. 2019-146234 filed on Aug. 8, 2019 and is a Continuation Application of PCT Application No. PCT/JP2020/029852 filed on Aug. 4, 2020. The entire contents of each application are hereby incorporated herein by reference.

BACKGROUND OF THE INVENTION

1. Field of the Invention

The present invention relates to a multilayer substrate including insulating base materials that are stacked and a method of manufacturing a multilayer substrate.

2. Description of the Related Art

Conventionally, a multilayer substrate is known which is configured by stacking and thermocompression-bonding insulating base materials formed with conductor patterns.

For example, International Publication No. 2018/074139 discloses a multilayer substrate in which an insulating protective film is formed on at least one surface side of a conductor pattern in order to prevent a short circuit between the conductor patterns resulting from the displacement of the conductor patterns due to the flow of an insulating base material during thermocompression-bonding.

In a multilayer substrate formed by stacking and thermocompression-bonding a plurality of insulating base materials, there is no adhesive layer joining the base materials. Thus, the entire stacked insulating base materials flow during thermocompression-bonding, and the displacement, inclination, and deformation of conductor patterns are relatively large. Further, in a multilayer substrate in which conductor patterns face each other in a stacking direction via a prepreg in an uncured state, the prepreg flows before the thermosetting, and the displacement, inclination, and deformation of the conductor patterns are relatively large. In these structures, when the surfaces of the conductor patterns on which an insulating protective film is not formed are arranged to face each other, there is a concern that the conductor patterns conduct to each other in the state of not being insulated by the insulating protective film. That is, in a case where the conductor patterns facing each other with the insulating base material interposed therebetween are formed on both surfaces of the insulating base material or in a case where the conductor patterns are formed on the surfaces, which are on the sides separated from each other, of the insulating base materials adjacent to each other in the stacking direction, there is a concern that portions, which are not protected by the insulating protective film, of the conductor patterns come into contact with each other.

SUMMARY OF THE INVENTION

Preferred embodiments of the present invention provide multilayer substrates that each effectively reduce or prevent contact between a plurality of conductor patterns due to displacement, inclination, and deformation of the conductor patterns, and methods for manufacturing the same.

A multilayer substrate according to a preferred embodiment of the present disclosure includes a plurality of insulating base materials stacked in a stacking direction, at least one conductor pattern on at least one of the plurality of insulating base materials, the at least one conductor pattern including two opposite major surfaces, and insulating protective films on both of the two opposite major surfaces of the at least one conductor pattern.

The above configuration provides a structure such that the insulating protective films may be provided on both major surfaces of a conductor pattern in the stacking direction.

A method of manufacturing a multilayer substrate according to a preferred embodiment of the present disclosure includes forming insulating protective films on two opposite major surfaces of a conductor film, pasting the conductor film formed with the insulating protective films on an insulating base material and patterning the conductor film formed with the insulating protective films to form a conductor pattern, and stacking a plurality of insulating base materials including the insulating base material formed with the conductor pattern and integrating the insulating base materials by thermocompression-bonding.

By such a manufacturing method, the multilayer substrate is obtained in which the insulating protective films are provided on both surfaces of the conductor pattern in the stacking direction.

A method of manufacturing a multilayer substrate according to a preferred embodiment of the present disclosure includes forming a stacked body in which an insulating base material, a first insulating protective film, and a conductor film are stacked in this order, forming a conductor pattern by patterning the conductor film, forming a second insulating protective film covering the conductor pattern on the insulating base material, and stacking a plurality of insulating base materials including the insulating base material formed with the conductor pattern and integrating the insulating base materials by thermocompression-bonding.

By such a manufacturing method, the multilayer substrate is obtained in which the insulating protective film is provided around the conductor pattern.

According to preferred embodiments of the present invention, it is possible to obtain multilayer substrates in each of which a short circuit between a plurality of conductor patterns due to the displacement, inclination, and deformation of the conductor patterns is effectively reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A and 5B are partial cross-sectional views illustrating an internal configuration of another multilayer substrate 102B according to the second preferred embodiment of the present invention.

DETAILED DESCRIPTION OF THE PREFERRED EMBODIMENTS

Figure 1:
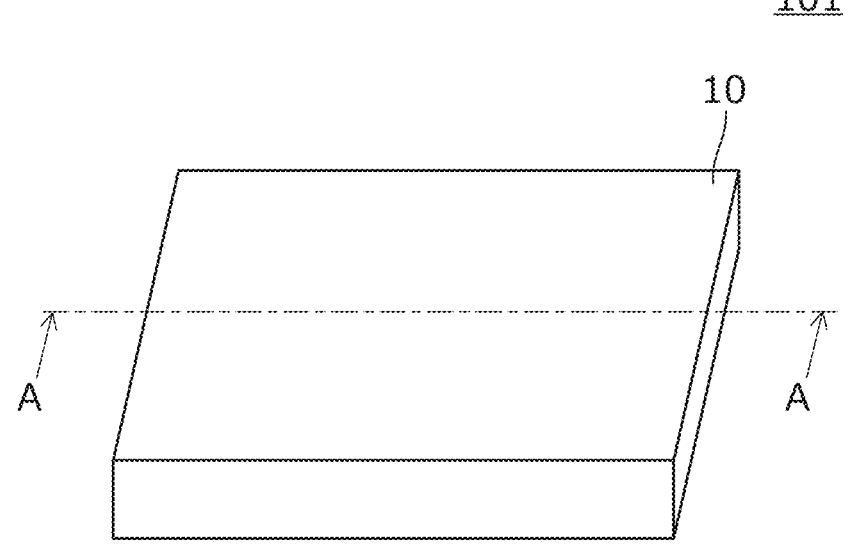
FIG. 1 is a perspective view of a multilayer substrate 101 according to a first preferred embodiment of the present invention.
Figure 1:
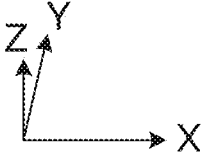

Preferred embodiments of the present invention will be described with reference to the drawings. In the drawings, the same reference signs are assigned to the same or corresponding portions. In consideration of ease of explanation or understanding of the main points, the preferred embodiments are described separately for convenience, but the components described in different preferred embodiments can be partially replaced or combined. In second and subsequent preferred embodiments, descriptions of matters common to those in a first preferred embodiment are omitted, and only different points will be described. In particular, the same advantageous actions and effects by the same or substantially the same configurations will not be sequentially described for each preferred embodiment.

First Preferred Embodiment

Figure 2A:
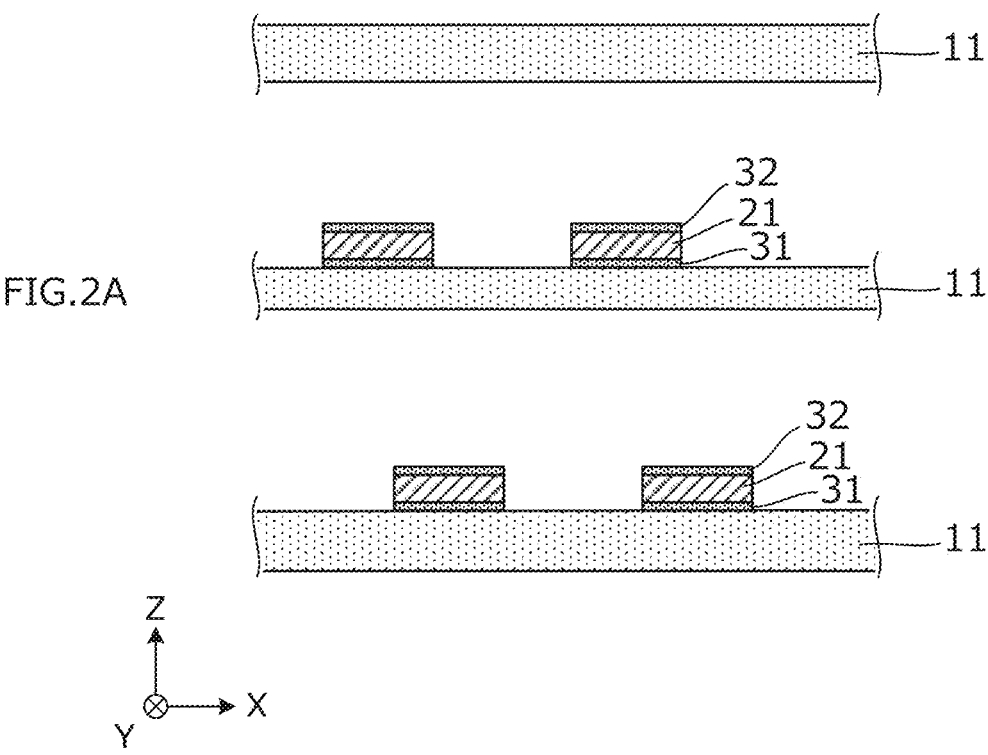
FIGS. 2A and 2B are partial cross-sectional views illustrating an internal configuration of the multilayer substrate 101.
Figure 2B:
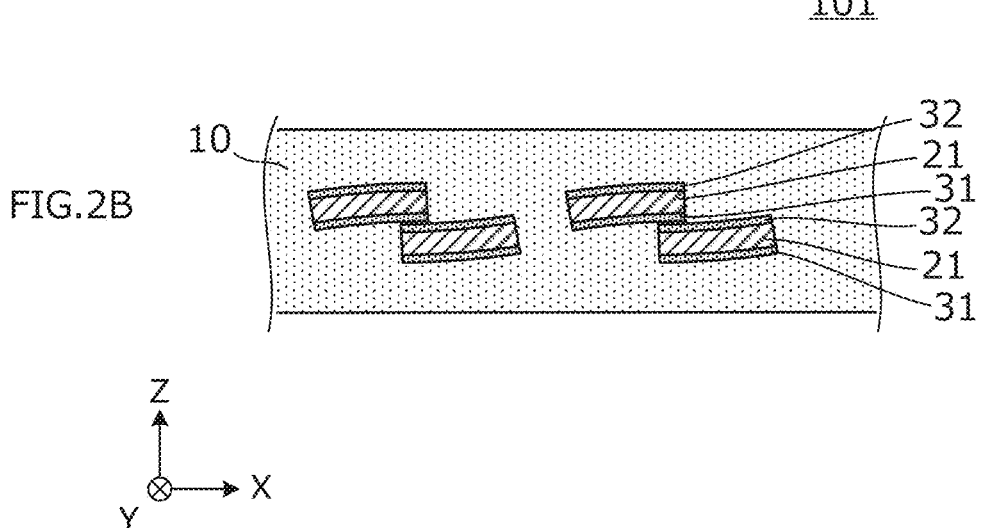

FIG. 1 is a perspective view of a multilayer substrate 101 according to a first preferred embodiment of the present invention. FIGS. 2A and 2B are partial cross-sectional views illustrating an internal configuration of the multilayer substrate 101. FIG. 2A is a partial cross-sectional view of a plurality of base materials at a stage before a stack press. FIG. 2B is a partial cross-sectional view after the stack press, and is a partial cross-sectional view of an A-A portion in FIG. 1.

In the present preferred embodiment, the multilayer substrate 101 has a rectangular or substantially rectangular parallelepiped appearance. The multilayer substrate 101 includes a plurality of insulating base materials 11 each made of a thermoplastic resin, and a conductor pattern 21 provided on a predetermined insulating base material 11 among the insulating base materials 11. In the present preferred embodiment, the number of stacked base materials is reduced in consideration of the clarity of the drawings and the ease of explanation.

An insulating protective film 31 is provided on the lower surface of the conductor pattern 21, and an insulating protective film 32 is provided on the upper surface of the conductor pattern 21. As illustrated in FIGS. 2A and 2B, the insulating protective films 31 and 32 are provided on both the lower surface and the upper surface of all of the conductor patterns 21.

The insulating base material 11 is a sheet material of a thermoplastic resin such as, for example, a liquid crystal polymer (LCP). The conductor pattern 21 is, for example, a pattern of a copper foil, and the insulating protective films 31 and 32 are, for example, an electrically insulating copper oxide film provided on the surface of the copper foil, as will be described later.

The plurality of conductor patterns 21 including the insulating protective film 31 provided on the lower surface and the insulating protective film 32 provided on the upper surface are provided on the plurality of insulating base materials 11 in a state before the stack press as illustrated in FIG. 2A. In the state before the stack press, the conductor pattern 21 is provided on the insulating base material 11 such that the insulating protective film 31 comes into contact with the insulating base material 11. From the state illustrated in FIG. 2A, the plurality of insulating base materials 11 are stacked and heat-pressed, so that the multilayer substrate 101 is provided in which the conductor pattern 21 and the insulating protective films 31 and 32 are embedded in an insulating base material 10 as illustrated in FIG. 2B. The insulating base material 10 is a base material including the plurality of insulating base materials 11 that are stacked.

When the resin of the insulating base material 11 flows during the heat-pressing, the conductor patterns 21 and the insulating protective films 31 and 32 may be displaced, inclined, or deformed as illustrated in FIG. 2B. As a result, the conductor patterns 21 coated with the insulating protective films 31 and 32 may be in close proximity to each other.

However, with the conductor patterns 21 and 21 facing each other in the stacking direction, in this example, the upper conductor pattern 21 and the lower conductor pattern 21 are protected by the insulating protective films 31 and 32, respectively. Since the conductor pattern 21 is protected by the insulating protective films 31 and 32, it is possible to reduce or prevent the conductor patterns 21 from coming into contact with each other (short circuit).

For example, it is possible to reduce or prevent the conductor patterns 21 from being short-circuited when the insulating protective film 31 provided on the lower surface of the upper conductor pattern 21 and the insulating protective film 32 provided on the upper surface of the lower conductor pattern 21 come into contact with or are in close proximity to each other as illustrated in FIG. 2B when viewed from the Y direction.

Figures 3A, 3B, 3C:
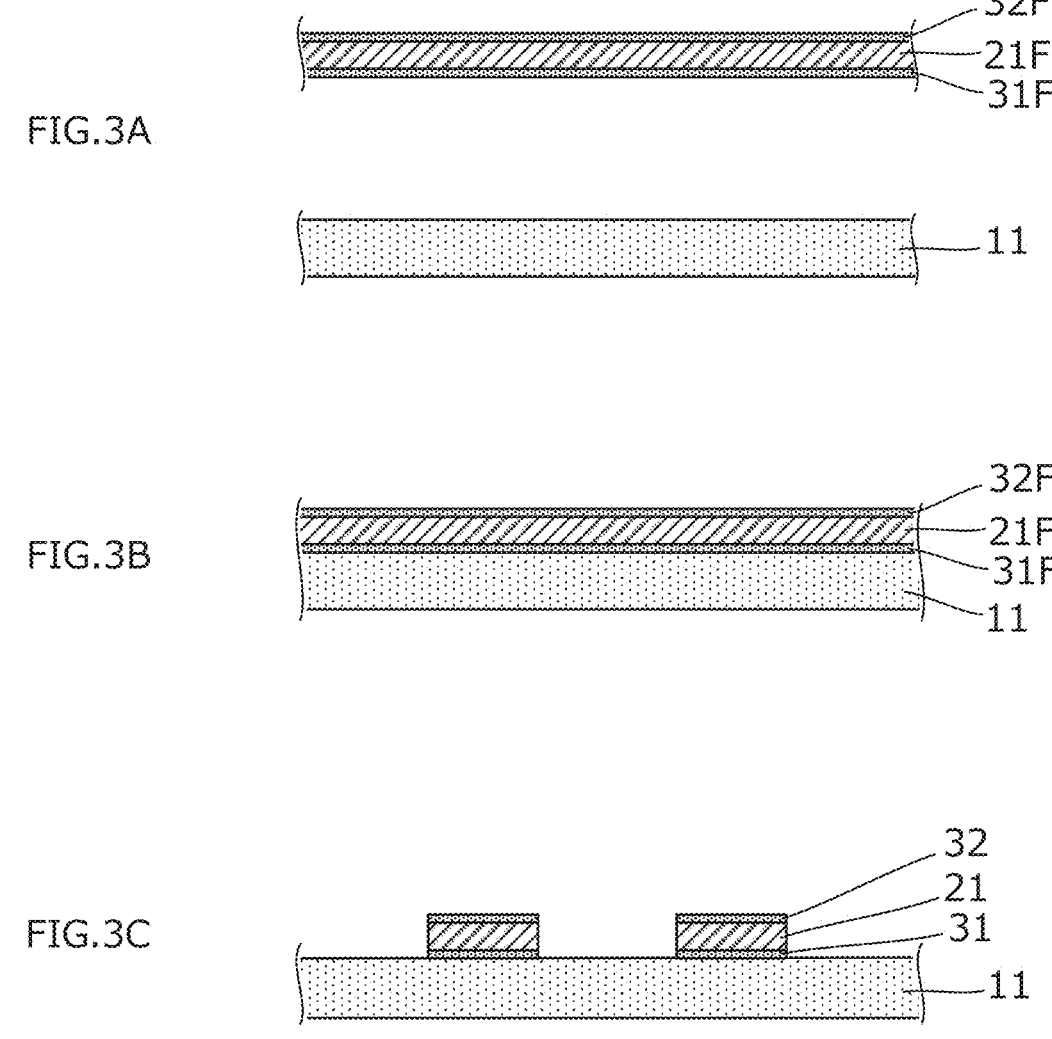
FIGS. 3A to 3C are partial cross-sectional views illustrating a method of forming a conductor pattern 21 and insulating protective films 31 and 32 with respect to an insulating base material 11 illustrated in FIGS. 2A and 2B.

FIGS. 3A to 3C are partial cross-sectional views illustrating a non-limiting example of a method of forming the conductor pattern 21 and the insulating protective films 31 and 32 with respect to the insulating base material 11d in FIGS. 2A and 2B. In this example, first, when a conductor film 21F is subjected to an oxidation treatment, for example, by oxygen plasma treatment as illustrated in FIG. 3A, insulating protective films 31F and 32F, which are oxide films, are formed on both surfaces of the conductor film 21F. For example, the conductor film 21F is a metal foil such as a copper foil or an aluminum foil, and the insulating protective films 31F and 32F are metal oxide films such as a copper oxide film and an aluminum oxide film. The insulating protective films 31F and 32F are thinner than the conductor films 21F. For example, the thickness of the conductor film 21F is about 10 μm, and the thickness of the insulating protective films 31F and 32F is about 3 μm to about 5 μm. The conductor film 21F formed with the insulating protective films 31F and 32F is pasted on the insulating base material 11 such that the insulating protective film 31F and the insulating base material 11 face each other (contact). For example, in the insulating base material 11 which is a thermoplastic resin sheet such as, for example, a liquid crystal polymer (LCP), a copper foil formed with a copper oxide film is thermocompression-bonded to the thermoplastic resin sheet to be integrated. For example, heat-pressing is performed at a predetermined temperature (for example, 300° C.) within a range of about 180° C. or more and about 320° C. or less. Thereafter, as illustrated in FIG. 3C, the conductor film 21F coated with the insulating protective films 31F and 32F is patterned by etching. For example, the patterning is performed by photolithography.

Since a difference in the coefficient of thermal expansion between the insulating protective films 31F and 32F and the conductor film 21F is large, it is preferable that the insulating protective films 31F and 32F are thinner than the conductor films 21F. However, since the insulating protective films 31F and 32F are formed on both surfaces of the conductor film 21F, even when there is the above-described difference in the coefficient of thermal expansion, the distortion is canceled out, so that warpage and twisting are small.

In this way, the insulating base material 11 is configured to include the conductor pattern 21 which includes the insulating protective films 31 and 32 on both surfaces.

Although FIGS. 2A and 2B illustrate examples in which the insulating protective films 31 and 32 are provided on both surfaces of all of the conductor patterns 21, only one pair of the conductor patterns which may be close to each other in the stacking direction may be provided with the insulating protective films 31 and 32 on both surfaces of the conductor pattern.

According to the present preferred embodiment, as described above, the insulating protective films 31F and 32F are thinner than the conductor films 21F, and thus the above-described patterning by photolithography or the like can be efficiently performed. Further, when the conductor film 21F is configured with a metal foil, and the insulating protective films 31 and 32 are configured with a metal oxide film, it is possible to form the conductor pattern with the insulating protective film provided on both surfaces with a small number of man-hours. Further, since the insulating base material 11 is a thermoplastic resin, the insulating base materials 11 can be directly thermocompression-bonded to each other. Therefore, a thin multilayer substrate can be provided with a small number of layers. Further, for example, a multilayer substrate can be manufactured with a smaller number of man-hours as compared with a stacked structure obtained by joining a plurality of thermosetting base materials via an adhesive layer.

In the above examples, the multilayer substrate which includes the insulating base material made of a thermoplastic resin is described, but the same or substantially the same can be applied to a multilayer substrate which includes an insulating base material made of a thermosetting resin. For example, the same or substantially the same can be applied to a multilayer substrate in which conductor patterns face each other in the stacking direction via a prepreg in an uncured state (a base material obtained by impregnating a glass cloth with a thermosetting resin such as, for example, an epoxy resin and curing the result to a B stage (semi-cured)). This also applies to the other preferred embodiments described below.

Second Preferred Embodiment

A second preferred embodiment of the present invention describes a multilayer substrate in which a positional relationship of the conductor patterns which are close to each other after stacking is different from the example described in the first preferred embodiment.

Figure 4A:
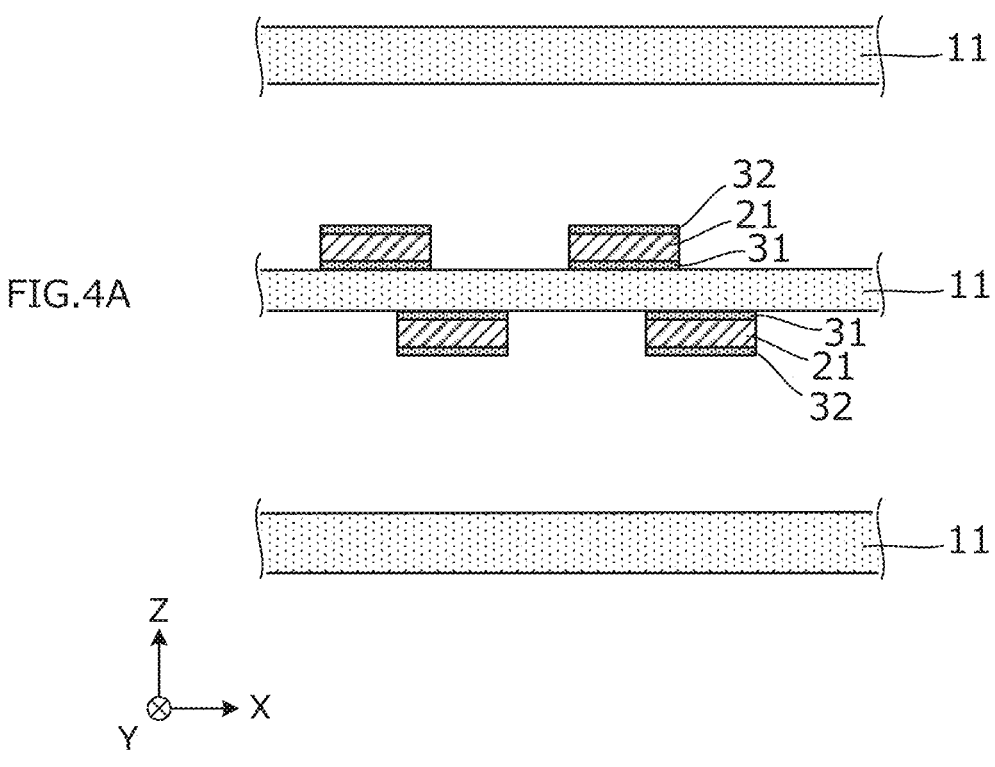
FIGS. 4A and 4B are partial cross-sectional views illustrating an internal configuration of a multilayer substrate 102A according to a second preferred embodiment of the present invention.
Figure 4B:
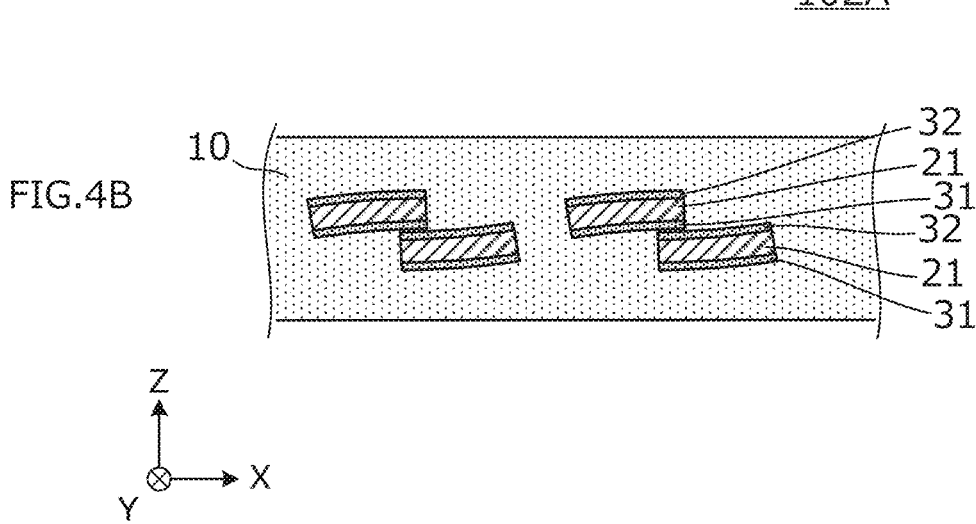

FIGS. 4A and 4B are partial cross-sectional views illustrating an internal configuration of a multilayer substrate 102A according to the second preferred embodiment. FIG. 4A is a partial cross-sectional view of the plurality of base materials at the stage before the stack press. FIG. 4B is a partial cross-sectional view after the stack press. FIGS. 5A and 5B are partial cross-sectional views illustrating an internal configuration of another multilayer substrate 102B according to the second preferred embodiment. FIG. 5A is a partial cross-sectional view of the plurality of base materials at the stage before the stack press. FIG. 5B is a partial cross-sectional view after the stack press.

Each of the multilayer substrates 102A and 102B includes the plurality of insulating base materials 11 each made of a thermoplastic resin, and the conductor pattern 21 provided on a predetermined insulating base material 11 among these insulating base materials 11.

An insulating protective film 31 is provided on the lower surface of the conductor pattern 21, and an insulating protective film 32 is provided on the upper surface of the conductor pattern 21. In the examples illustrated in FIGS. 4A and 4B, unlike the examples illustrated in FIGS. 2A and 2B, the conductor patterns 21 coated with the insulating protective films 31 and 32 are provided on both surfaces of the predetermined insulating base material 11. Further, in the examples illustrated in FIGS. 5A and 5B, the insulating base material 11 including the conductor pattern 21 coated with the insulating protective films 31 and 32 on the upper surface and the insulating base material 11 including the conductor pattern 21 coated with the insulating protective films 31 and 32 on the lower surface are arranged adjacent to each other in the stacking direction. Other configurations are the same or substantially the same as described in the first preferred embodiment.

From the state illustrated in FIG. 4A, the plurality of insulating base materials 11 are stacked and heat-pressed, so that the multilayer substrate 102A is configured in which the conductor pattern 21 and the insulating protective films 31 and 32 are embedded in the insulating base material 10 as illustrated in FIG. 4B. Similarly, from the state illustrated in FIG. 5A, the plurality of insulating base materials 11 are stacked and heat-pressed, so that the multilayer substrate 102B is configured in which the conductor pattern 21 and the insulating protective films 31 and 32 are embedded in the insulating base material 10 as illustrated in FIG. 5B. The insulating base material 10 is a base material integrated by stacking the plurality of insulating base materials 11.

As illustrated in FIG. 5B, the conductor patterns 21 coated with the insulating protective films 31 and 32 may be in close proximity to each other due to the flow of the resin of the insulating base material 11 during the heat-pressing. However, since the conductor pattern 21 is protected by the insulating protective films 31 and 32, it is possible to reduce or prevent the conductor patterns 21 from coming into contact with each other (short circuit).

Figure 15A:
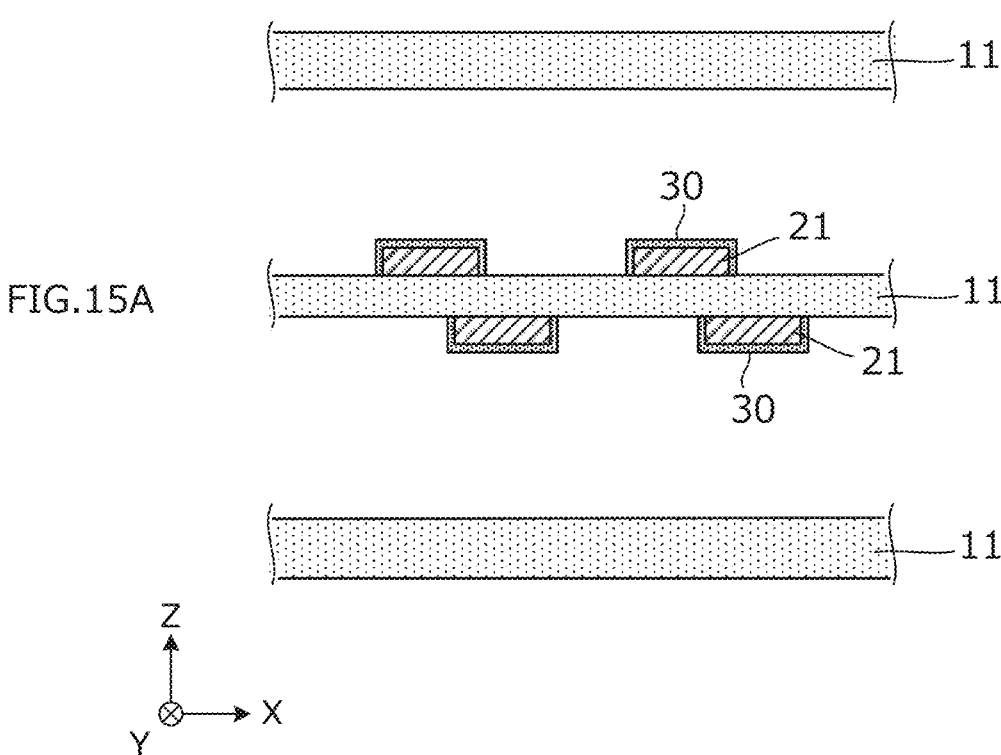
FIGS. 15A and 15B are comparative examples with respect to the multilayer substrate 102A illustrated in FIGS. 4A and 4B.
Figure 15B:
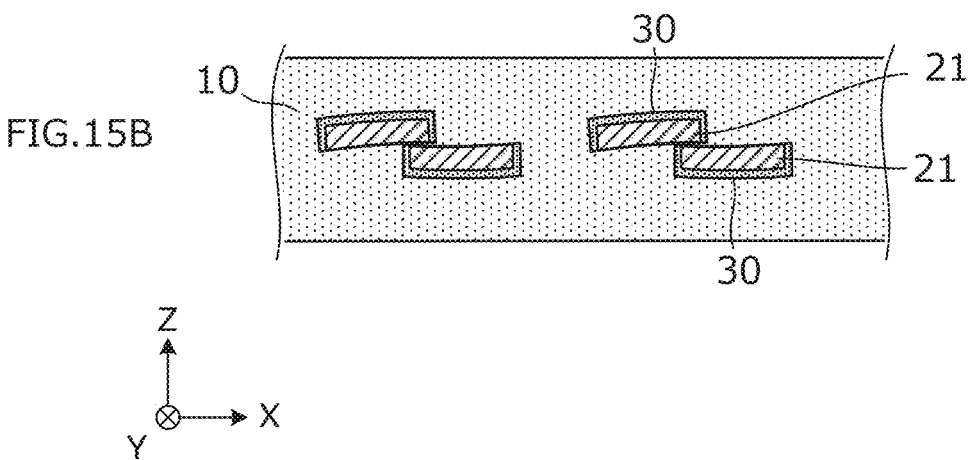
Figure 16A:
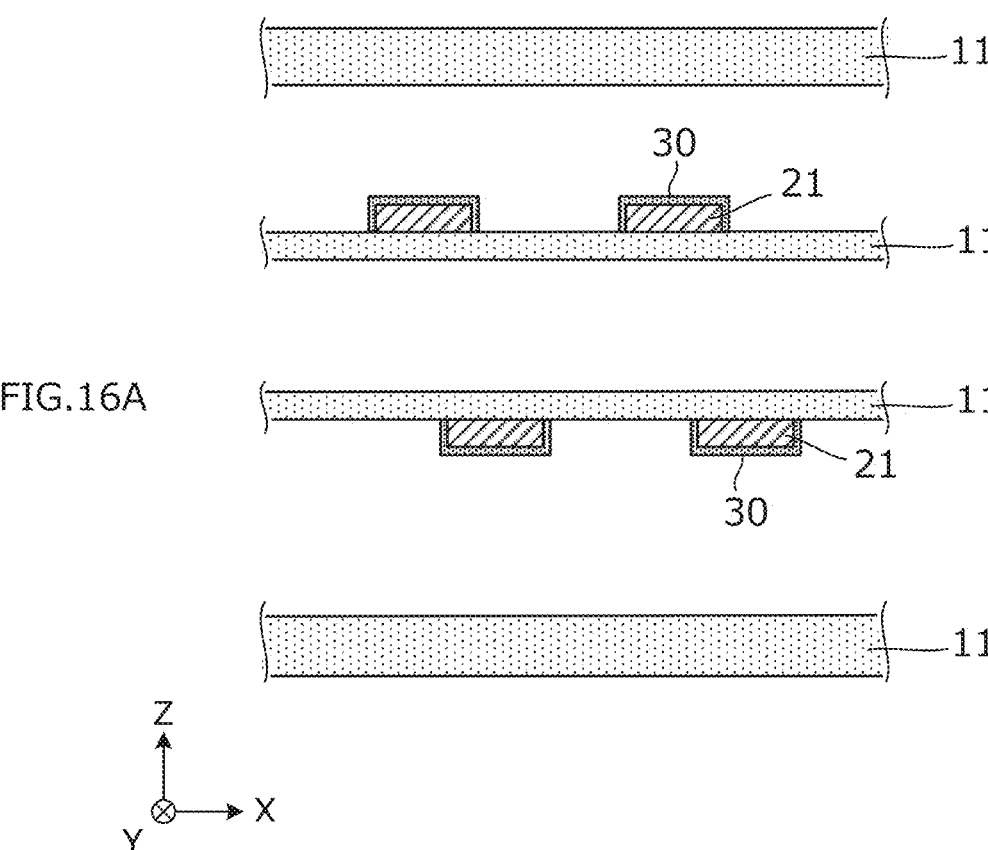
FIGS. 16A and 16B are comparative examples with respect to the multilayer substrate 102B illustrated in FIGS. 5A and 5B.
Figure 16B:
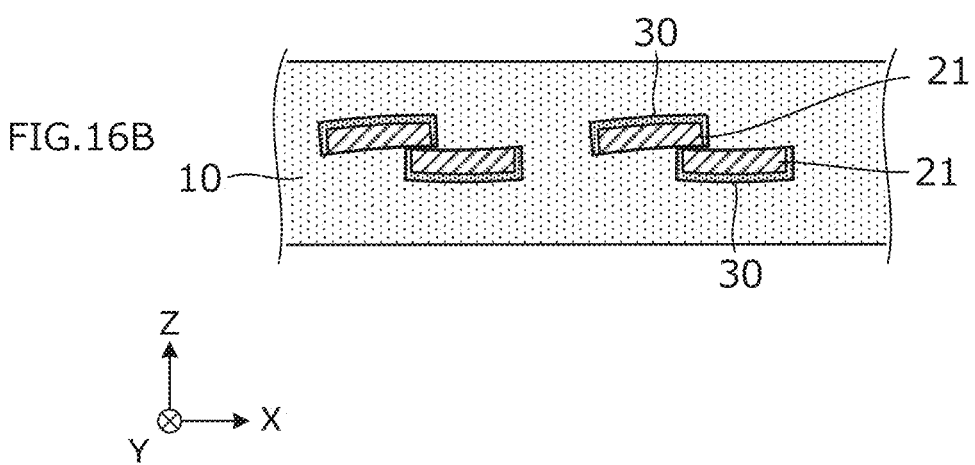

Here, the configuration and problems of the multilayer substrate as a comparative example will be described with reference to FIGS. 15A, 15B, 16A, and 16B. FIGS. 15A and 15B are comparative examples with respect to the multilayer substrate 102A illustrated in FIGS. 4A and 4B. Further, FIGS. 16A and 16B are comparative examples with respect to the multilayer substrate 102B illustrated in FIGS. 5A and 5B. FIG. 15A is a partial cross-sectional view of a plurality of base materials at a stage before the stack press, and FIG. 15B is a partial cross-sectional view after the stack press. Similarly, FIG. 16A is a partial cross-sectional view of a plurality of base materials in a multilayer substrate of another example at a stage before the stack press, and FIG. 16B is a partial cross-sectional view after the stack press.

In both of the examples illustrated in FIGS. 15A and 16A, the exposed surface of the conductor pattern provided on the insulating base material 11 is coated with an insulating protective film 30. In the structure in which the conductor patterns 21 are arranged such that the surfaces not coated with the insulating protective film 30 face each other in this way, there is a concern that the conductor patterns 21 come into contact with each other as illustrated in FIGS. 15B and 16B.

On the other hand, in the multilayer substrates 102A and 102B of the present preferred embodiment, as described above, the conductor pattern 21 is protected by the insulating protective films 31 and 32, and thus it is possible to reduce or prevent the conductor patterns 21 from coming into contact with each other (short circuit).

Third Preferred Embodiment

Figure 6:
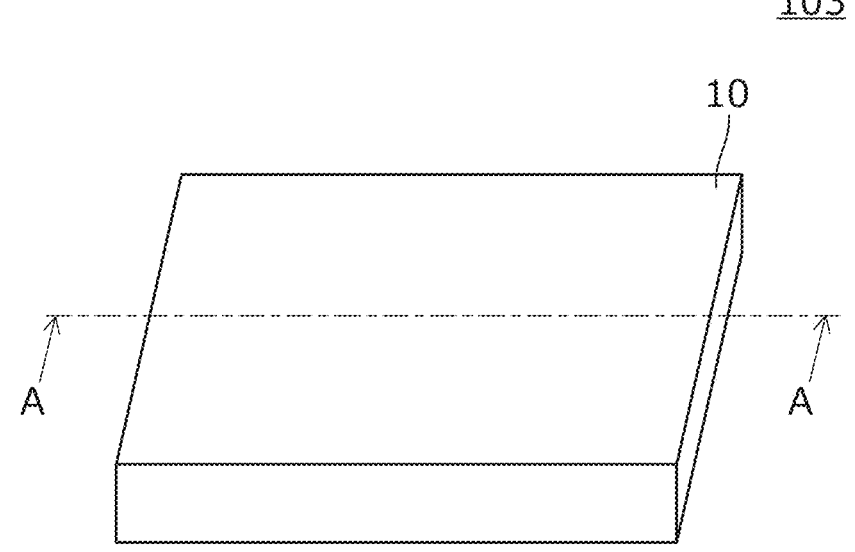
FIG. 6 is a perspective view of a multilayer substrate 103 according to a third preferred embodiment of the present invention.
Figure 6:
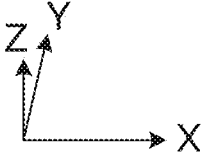
Figure 7:
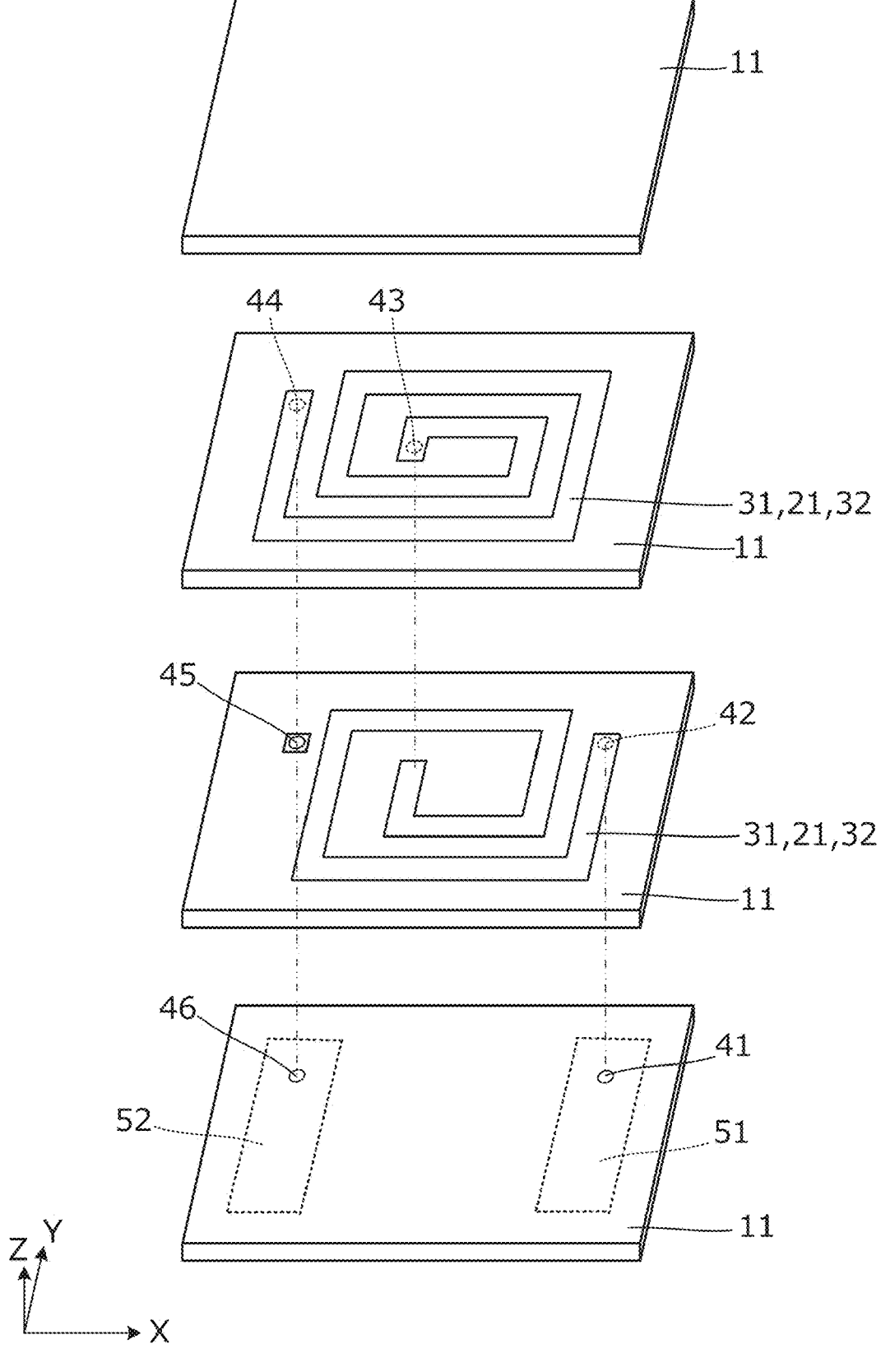
FIG. 7 is an exploded perspective view of the multilayer substrate 103.

A third preferred embodiment of the present invention describes a multilayer substrate including an interlayer connection conductor. FIG. 6 is a perspective view of a multilayer substrate 103 according to the third preferred embodiment. FIG. 7 is an exploded perspective view of the multilayer substrate 103. The multilayer substrate 103 includes a plurality of insulating base materials 11 that are stacked. Each insulating base material 11 is made of a thermoplastic resin.

In FIG. 7, the conductor patterns 21 coated with the insulating protective films 31 and 32 are provided on the upper surfaces of the insulating base material 11 of the second layer from the bottom and the insulating base material 11 of the third layer from the bottom. The conductor patterns 21 coated with the insulating protective films 31 and 32 are all rectangular or substantially rectangular spiral coil conductor patterns.

In FIG. 7, terminal electrodes 51 and 52 are provided on the lower surface of the insulating base material 11 of the lowermost layer. The terminal electrode 51 and the outer end of the conductor pattern 21 of the second layer from the bottom are connected via interlayer connection conductors 41 and 42, and the inner end of the conductor pattern 21 of the second layer from the bottom and the inner end of the conductor pattern 21 of the third layer from the bottom are connected via an interlayer connection conductor 43. Further, the outer end of the conductor pattern 21 of the third layer from the bottom and the terminal electrode 52 are connected via interlayer connection conductors 44, 45, and 46.

Each of the interlayer connection conductors 41, 42, 43, 44, 45, and 46 is formed by printing and applying, for example, a Sn-based conductive paste in a hole in the base material, melting the result with the heat at the time of heat-pressing, and then solidifying the result.

Figure 8A:
FIGS. 8A to 8D are cross-sectional views illustrating a procedure of a method of forming a conductor pattern and an interlayer connection conductor illustrated in FIG. 7.
Figure 8B:
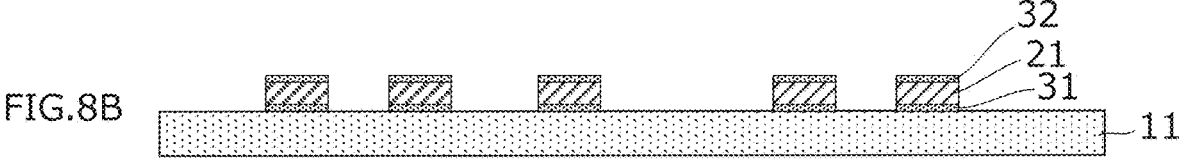
Figure 8C:
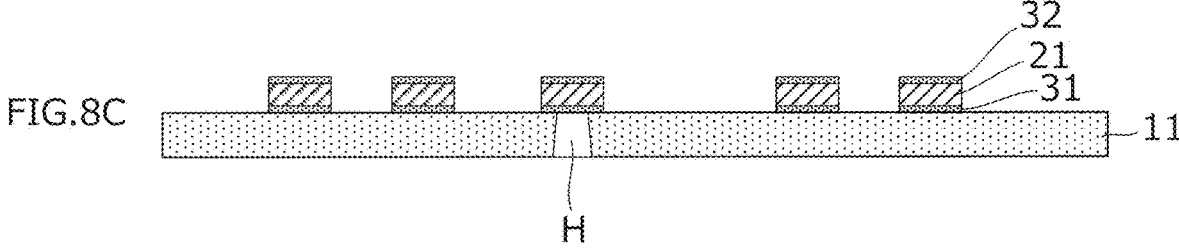
Figure 8D:
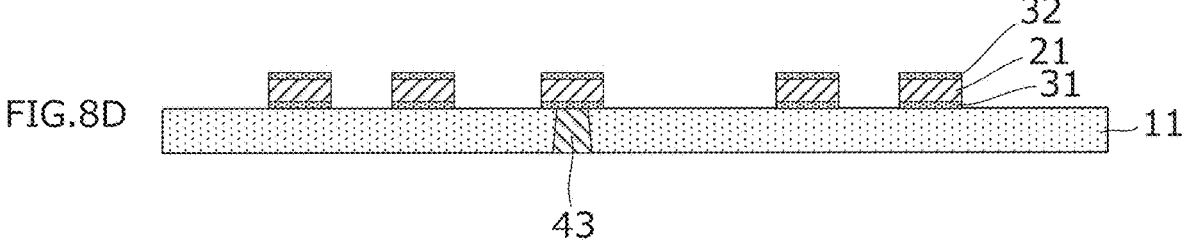

FIGS. 8A to 8D are cross-sectional views illustrating a procedure of a non-limiting example of a method of forming the conductor pattern and the interlayer connection conductor illustrated in FIG. 7. First, the conductor film (for example, a copper foil) 21F formed with the insulating protective films (for example, copper oxide films) 31F and 32F is pasted on the insulating base material 11 (FIG. 8A). Next, the conductor film 21F coated with the insulating protective films 31F and 32F is patterned by etching (FIG. 8B). Thereafter, a hole H is formed in the insulating base material 11, and, for example, a Sn-based conductive paste including a reducing agent is printed and applied in the hole H and temporarily cured to form the interlayer connection conductor 43 before solidification. The reducing agent is, for example, an alcohol-based or aldehyde-based reducing agent.

Figure 9A:
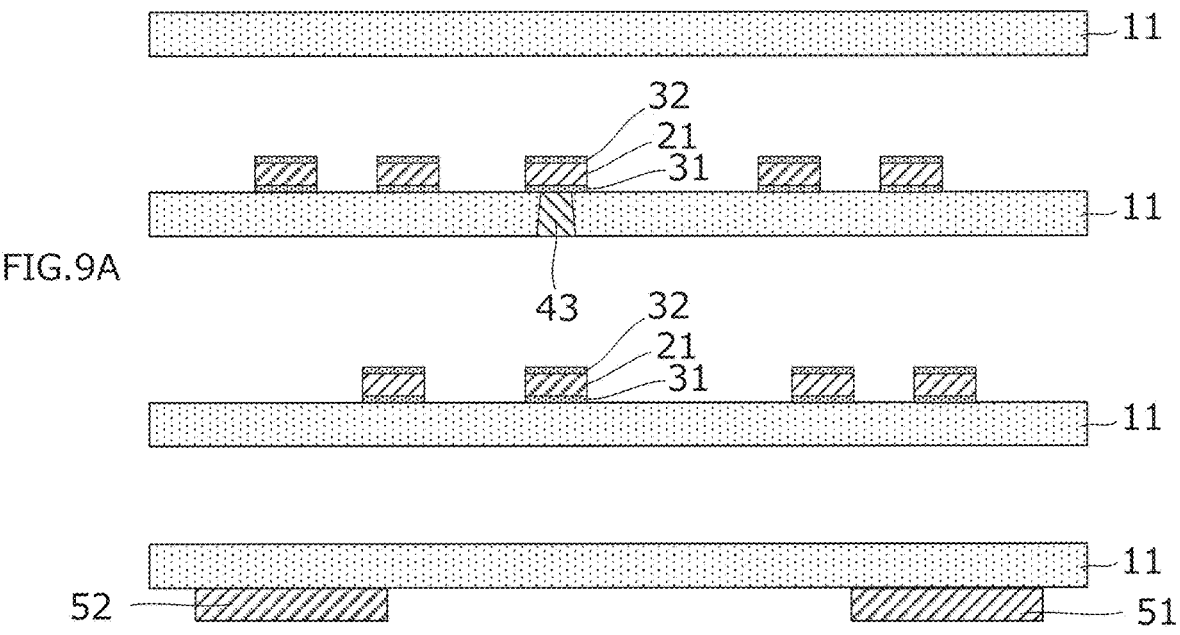
FIG. 9A is a cross-sectional view of a plurality of insulating base materials 11 of the multilayer substrate 103 according to the third preferred embodiment of the present invention at a stage before a stack press.
Figure 9B:
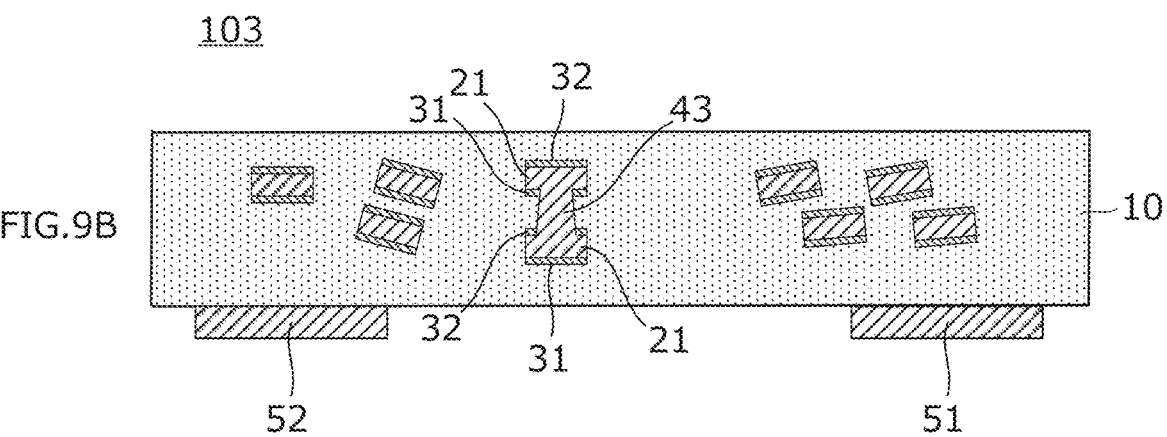
FIG. 9B is a cross-sectional view after the stack press.

FIG. 9A is a cross-sectional view of the plurality of insulating base materials 11 of the multilayer substrate 103 of the present preferred embodiment at a stage before the stack press, and FIG. 9B is a cross-sectional view after the stack press. In FIG. 9A, the insulating base material 11 of the third layer from the bottom is the insulating base material 11 illustrated in FIG. 8D. The conductor pattern 21 with the insulating protective films 31 and 32 formed on both surfaces is provided on the insulating base material 11 of the second layer from the bottom.

When the insulating base materials 11 are stacked and heat-pressed, in each portion of the insulating protective films 31 and 32 in contact with the interlayer connection conductor 43, the oxide film is reduced by the reducing agent included in the conductive paste so that the portion becomes a conductor, or the insulating protective films are removed so that the conductor patterns 21 become electrically conductive with each other via the interlayer connection conductor 43.

In this way, a coil device and an inductor are provided. In particular, in a case where the coil conductor patterns are stacked, the advantageous actions and effects of preferred embodiments of the present invention are remarkably provided.

Fourth Preferred Embodiment

A fourth preferred embodiment of the present invention illustrates a multilayer substrate including an insulating protective film other than the oxide film and a non-limiting example of a method for manufacturing the same.

Figure 10A:
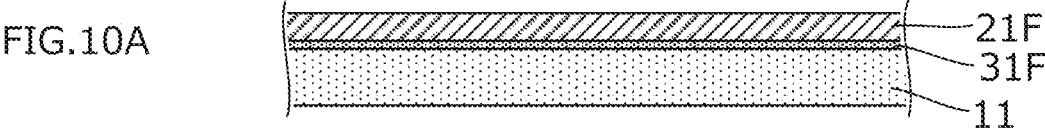
FIGS. 10A to 10C are cross-sectional views illustrating a method of forming an insulating protective film and a conductor pattern included in a multilayer substrate according to a fourth preferred embodiment of the present invention.
Figure 10B:
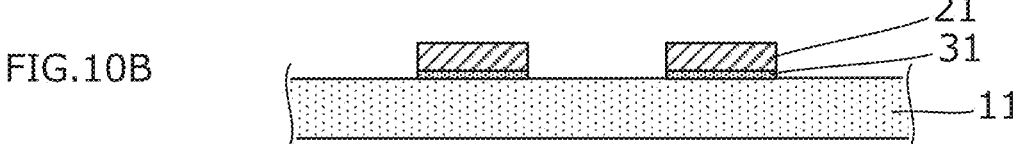
Figure 10C:
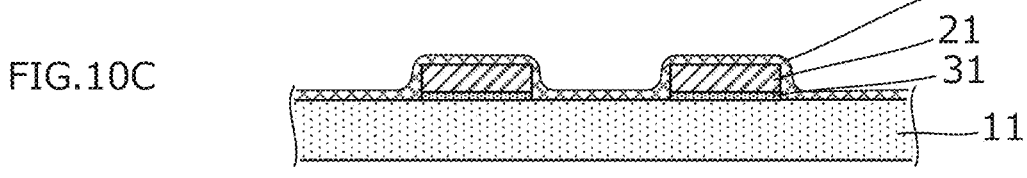
Figure 11:
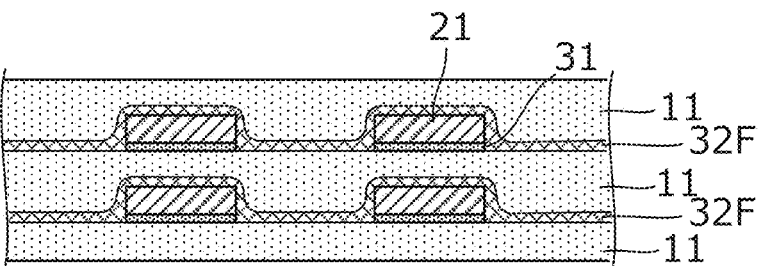
FIG. 11 is a cross-sectional view of the multilayer substrate 104 according to the fourth preferred embodiment of the present invention.

FIGS. 10A, 10B, and 10C are cross-sectional views illustrating a non-limiting example of a method of forming the insulating protective film and the conductor pattern included in the multilayer substrate according to the fourth preferred embodiment. FIG. 11 is a cross-sectional view of a multilayer substrate 104 according to the fourth preferred embodiment.

First, a sheet having a three-layer structure is formed by the insulating base material 11, the first insulating protective film 31F, and the conductor film 21F (FIG. 10A). Here, the first insulating protective film 31F is, for example, a fluororesin film, and the conductor film 21F is a copper foil.

Next, the conductor film 21F is patterned together with the first insulating protective film 31F by, for example, photolithography or the like (FIG. 10B). Thereafter, the second insulating protective film 32F is printed and applied to the upper surface of the insulating base material 11 (FIG. 10C). This insulating protective film 32F is, for example, a fluororesin film.

Thereafter, each insulating base material 11 is stacked and heat-pressed at a predetermined temperature (for example, about 300° C.) within a range of, for example, about 180° C. or more and about 320° C. or less. As a result, as illustrated in FIG. 11, the multilayer substrate 104 having the conductor pattern 21 of which the circumference is coated with the insulating protective films 31 and 32F is obtained.

Examples of the fluororesin include:

PTFE=Polytetrafluoroethylene (4 fluoride),

PFA=Tetrafluoroethylene/Perfluoroalkyl Vinyl Ether Copolymer,

FEP=Tetrafluoroethylene/Hexafluoropropylene copolymer (4.6 fluoride),

ETFE=tetrafluoroethylene/ethylene copolymer,

PVDF=polyvinylidene fluoride (difluoride),

PCTFE=Polychlorotrifluoroethylene (trifluoride), and

ECTFE=chlorotrifluoroethylene/ethylene copolymer.

As in the present preferred embodiment, for example, an epoxy resin or a fluororesin having high adhesion can be used as the insulating protective films 31 and 32F. In a case where the insulating protective films 31 and 32F is displaced together with the conductor pattern 21 due to the high adhesion between the insulating protective films 31 and 32F and the conductor pattern 21 during thermocompression-bonding, the conductor pattern 21 is not exposed even when the thickness of the insulating protective films 31 and 32F is reduced. Therefore, the insulating property of the conductor pattern 21 is ensured.

When the insulating protective film is a fluororesin as in the present preferred embodiment, this fluororesin has a lower dielectric constant than the insulating base material 11 made of LCP or the like, and thus a change in the characteristics of the signal line caused by providing the insulating protective films 31 and 32F is small. Further, the insulating protective films 31 and 32F have a lower dielectric constant than the insulating base material 11 and have a low dielectric loss tangent, and thus the loss for high frequency signals can be reduced or prevented.

FIGS. 10 and 11 illustrate an example in which the insulating protective films 31 and 32F are thinner than the insulating base material 11, but the insulating protective films 31 and 32F may be thicker than the insulating base material 11. As a result, the low dielectric constant layer (insulating protective films 31 and 32F) close to the conductor pattern 21 becomes thicker, and thus a change in electrical characteristics due to displacement, inclination, and deformation of the conductor pattern 21 can be reduced, and the above-described low loss can be achieved effectively.

The insulating protective film 32F may be, for example, a thermosetting resin. For example, the insulating protective film 32F is formed by printing and applying a paste thermosetting resin on the upper surface of the insulating base material 11. The insulating protective film 32F made of this thermosetting resin is a film including, for example, as a main component, a thermosetting resin which is thermally cured at a temperature lower than the press temperature at the time of forming the staked body. For example, the insulating protective film is an epoxy adhesive. Subsequently, in the state of each insulating base material 11 (the state of a single body before the stacking), the insulating protective film 32F made of a thermosetting resin is thermally cured at a temperature lower than the press temperature at the time of forming the staked body. In a case where the thermosetting start temperature of this thermosetting resin is, for example, about 120° C. or higher, the insulating protective film 32F is thermally cured by heating at a temperature which is equal to or higher than about 120° C. and lower than the heat-pressing temperature. When this thermosetting resin is thermoset, a fluidity at high temperature is lower than that of the insulating base material 11. Therefore, the displacement, inclination, and deformation of the conductor pattern 21 are suppressed.

Fifth Preferred Embodiment

A fifth preferred embodiment of the present invention illustrates a multilayer substrate provided with an insulating protective film other than the oxide film and a non-limiting example of a method for manufacturing the same.

Figure 12A:
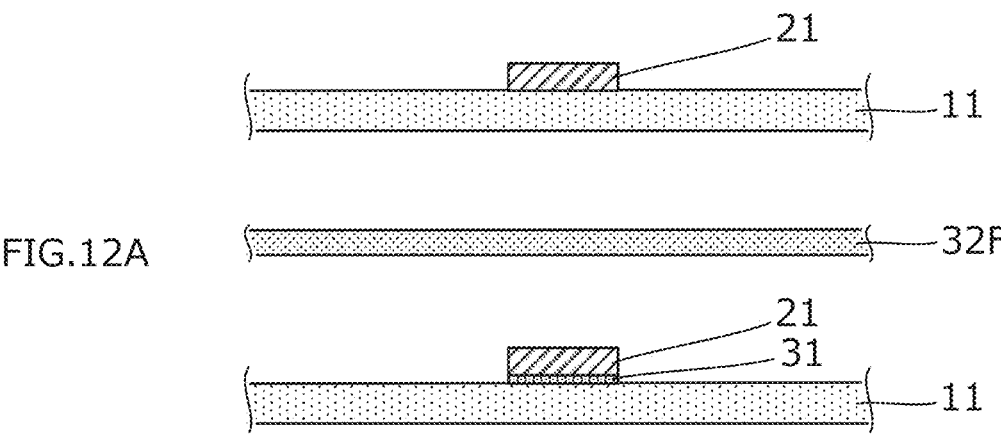
FIG. 12A is a cross-sectional view of a plurality of insulating base materials 11 of a multilayer substrate 105A according to a fifth preferred embodiment of the present invention before the stack press.
Figure 12B:
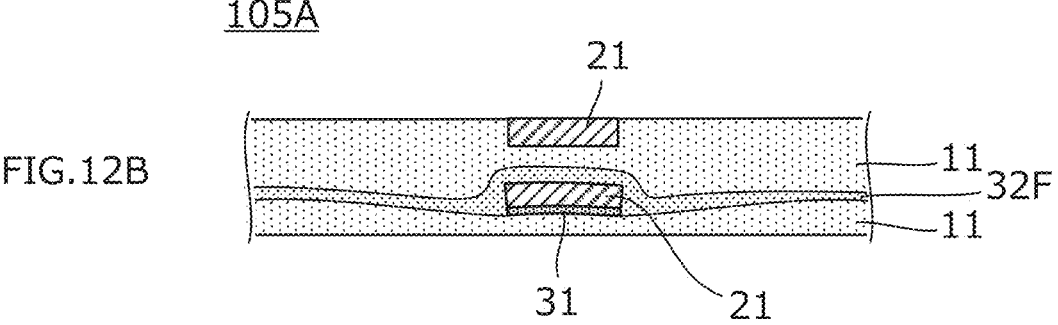
FIG. 12B is a sectional view of the multilayer substrate 105A after the stack press.

FIG. 12A is a cross-sectional view of the plurality of insulating base materials 11 of a multilayer substrate 105A according to the fifth preferred embodiment before the stack press, and FIG. 12B is a sectional view of the multilayer substrate 105A after the stack press. As illustrated in FIG. 12A, the stacking and heat-pressing are performed in a state where the insulating protective film 32F is interposed between the insulating base material 11 and the insulating base material 11 which are each formed with the conductor pattern 21. In FIG. 12A, the structure of the insulating protective film 31 and the conductor pattern 21 formed on the insulating base material 11 of the lowermost layer is the same or substantially the same as the structure illustrated in FIG. 10B.

By the above-described heat-pressing, as illustrated in FIG. 12B, the multilayer substrate 105A having the conductor pattern of which the circumference is coated with the insulating protective films 31 and 32F is obtained. With this structure, contact between conductor patterns 21 adjacent to each other in the stacking direction is avoided.

Figure 13A:
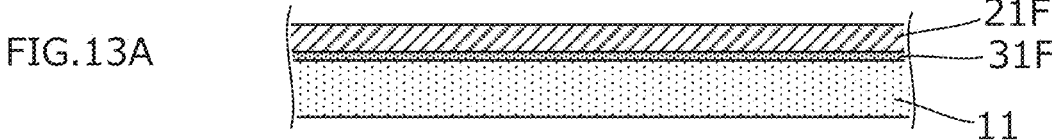
FIGS. 13A and 13B are cross-sectional views illustrating a method of forming an insulating protective film and a conductor pattern included in another multilayer substrate according to the fifth preferred embodiment of the present invention.
Figure 13B:
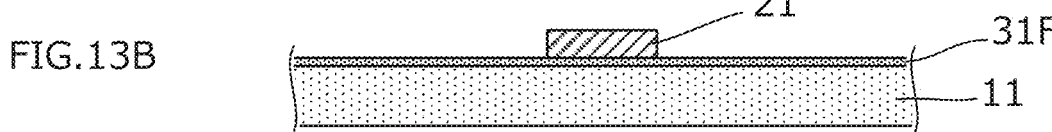

FIGS. 13A and 13B are cross-sectional views illustrating a non-limiting example of a method of forming the insulating protective film and the conductor pattern included in another multilayer substrate according to the fifth preferred embodiment. First, as illustrated in FIG. 13A, a sheet with a three-layer structure including the insulating base material 11, the insulating protective film 31F, and the conductor film 21F is formed. Here, the insulating protective film 31F is, for example, a fluororesin layer, and the conductor film 21F is, for example, a copper foil. Next, the conductor film 21F is patterned by, for example, photolithography or the like while leaving the insulating protective film 31F to form the conductor pattern 21 (FIG. 13B).

Figure 14A:
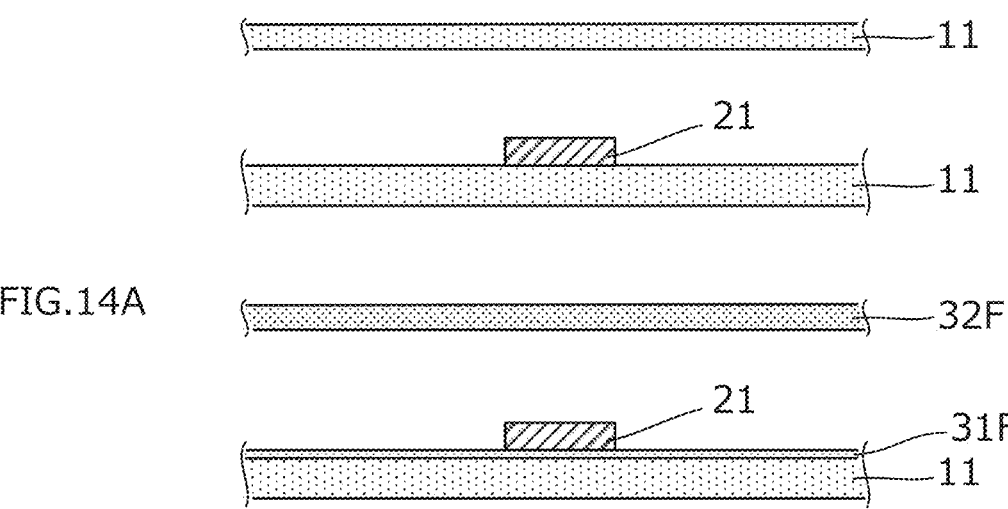
FIG. 14A is a cross-sectional view of a plurality of insulating base materials 11 of a multilayer substrate 105B according to the fifth preferred embodiment of the present invention before the stack press.
Figure 14B:
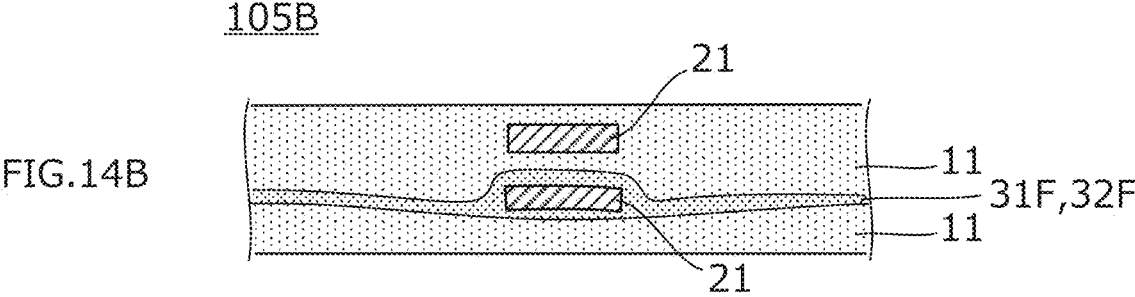
FIG. 14B is a sectional view of the multilayer substrate 105B after the stack press.

FIG. 14A is a cross-sectional view of the plurality of insulating base materials 11 of another multilayer substrate 105B according to the fifth preferred embodiment before the stack press, and FIG. 14B is a sectional view of the multilayer substrate 105B after the stack press. As illustrated in FIG. 14A, the stacking and heat-pressing are performed in a state where the insulating protective film 32F is interposed between the insulating base material 11 and the insulating base material 11 which are each formed with the conductor pattern 21.

By the above-described heat-pressing, as illustrated in FIG. 14B, the multilayer substrate 105B with the conductor pattern of which the circumference is coated with the insulating protective films 31F and 32F is obtained. With this structure, contact between conductor patterns 21 adjacent to each other in the stacking direction is avoided.

In FIG. 14A, an example is illustrated in which the individual insulating protective films 32F are stacked. However, the insulating protective film 32F may be applied and formed on the upper portion of the protective film 31F of the lowermost layer and the conductor pattern 21 illustrated in FIG. 14A. Alternatively, the insulating protective film may be applied and formed on the lower surface of the insulating base material 11 of the third layer from the bottom.

Similarly to the fourth preferred embodiment, the fifth preferred embodiment also has the following advantageous actions and effects.

In a case where the insulating protective films 31 and 32F (or 31F and 32F) are displaced together with the conductor pattern 21 during thermocompression-bonding since the adhesion between the insulating protective films 31 and 32F (or 31F and 32F) and the conductor pattern 21 is high, the conductor pattern 21 is not exposed even when the thickness of the insulating protective films 31 and 32F (or 31F and 32F) is reduced. Therefore, the insulating property of the conductor pattern 21 is ensured.

Since the insulating protective film has a low dielectric constant, a change in the characteristics of the signal line caused by providing the insulating protective films 31 and 32F (or 31F and 32F) is small. Further, the insulating protective films 31 and 32F (or 31F and 32F) have a lower dielectric constant than the insulating base material 11 and have a low dielectric loss tangent, and thus the loss for high frequency signals can be reduced or prevented.

Even in the fifth preferred embodiment, the insulating protective films 31 and 32F (or 31F and 32F) may be thicker than the insulating base material 11 similarly to the fourth preferred embodiment. As a result, the low dielectric constant layer (insulating protective films 31 and 32F (or 31F and 32F)) close to the conductor pattern 21 becomes thicker, and thus the change in electrical characteristics due to displacement, inclination, and deformation of the conductor pattern 21 is reduced, and the low loss can be effectively achieved.

The insulating protective film 32F may be a thermosetting resin, for example. As a result, the advantageous actions and effects as described in the fourth preferred embodiment are obtained.

Other Preferred Embodiments

The above-described first to fourth preferred embodiments describe examples in which all of the conductor patterns in the plurality of layers are coated with the insulating protective films. However, only one pair of the conductor patterns adjacent to each other in the stacking direction may be coated with the insulating protective film.

In some of the examples described above, the oxide film of the conductor pattern 21 or the oxide film of the conductor film 21F is used as the first insulating protective film 31 or the second insulating protective film 32, or the fluororesin layer is used as the first insulating protective film 31 or the second insulating protective film 32. However, other insulating materials may also be used. The first insulating protective film 31 and the second insulating protective film 32 may have higher fluidity than the insulating base material 11 at the temperature at the time of heat-pressing. It is preferable that the first insulating protective film 31 and the second insulating protective film 32 have higher adhesion to the conductor pattern 21 or the conductor film 21F than the insulating base material 11. As a result, even when the first insulating protective film 31 and the second insulating protective film 32 flow during heat-pressing, the first insulating protective film 31 and the second insulating protective film 32 can be brought into close contact with the conductor pattern 21.

In each of the above-described preferred embodiments, the multilayer substrate is described in which the number of stacked insulating base materials 11 is intentionally reduced. However, for example, the total number of stacked insulating base materials 11 may be about 20 layers.

As the thermoplastic resin used for the multilayer substrate of preferred embodiments of the present invention, for example, polyetheretherketone (PEEK) or the like can be used as well as the above-described LCP.

In each of the above-described preferred embodiments, one unit of components is illustrated. However, each process may be processed (manufactured by a large format process) in an aggregate substrate state including a plurality of element forming portions, and finally may be separated into individual pieces.

In the examples illustrated in FIGS. 7, 8A to 8D, 9A, and 9B, the coil device and the inductor are illustrated. However, the multilayer substrates of preferred embodiments of the present invention can be applied to various electronic components, such as an antenna, an actuator, and a sensor, for example. Further, the multilayer substrates of preferred embodiments of the present invention are not limited to the shape of chip components, and also include components with other arbitrary shapes.

In consideration of position accuracy and man-hours, it is preferable that the insulating protective film 31 covers the entire or substantially the entire lower surface of the conductor pattern 21 and the entire or substantially the entire upper surface of the conductor pattern 21 of the insulating protective film 32. However, the insulating protective films 31 and 32 on the conductor pattern 21 are not limited to the example in which the insulating protective films cover the upper surface and the lower surface of the conductor pattern 21 as in each of the above-described preferred embodiments.

Figure 17:
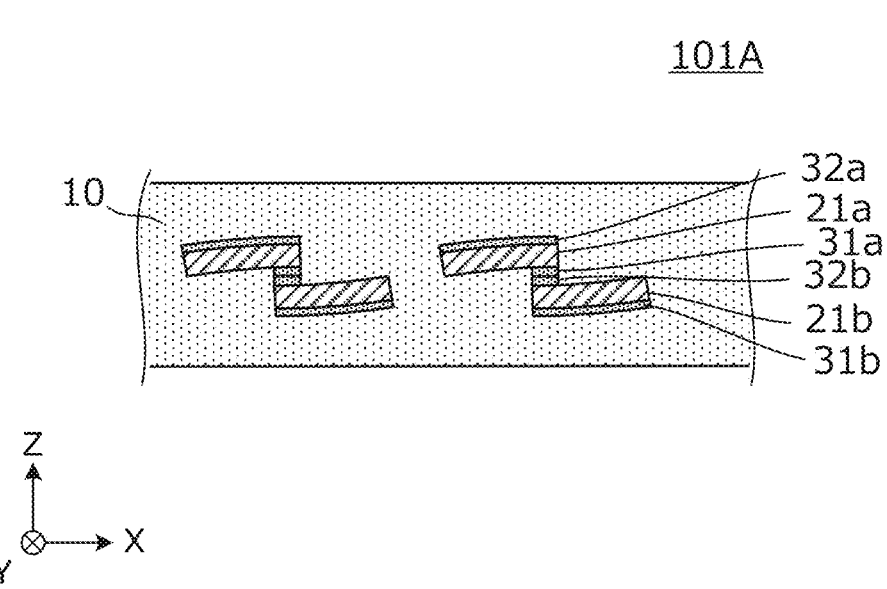
FIG. 17 is a partial cross-sectional view illustrating an internal configuration of a multilayer substrate 101A and illustrating insulating protective films 31a, 32a, 31b, and 32b formed on conductor patterns 21a and 21b.
Figure 18:
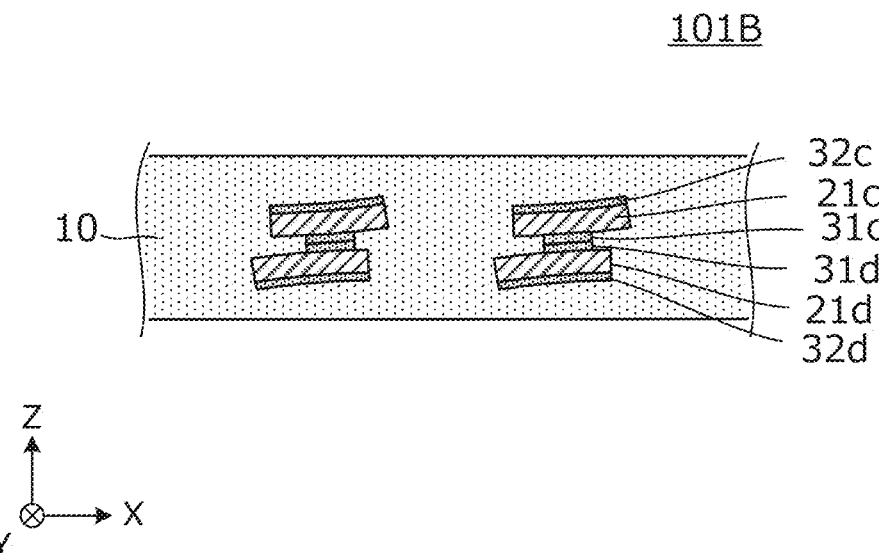
FIG. 18 is a partial cross-sectional view illustrating an internal configuration of a multilayer substrate 101B and illustrating insulating protective films 31c, 32c, 31d, and 32d formed on conductor patterns 21c and 21d.

FIG. 17 is a partial cross-sectional view illustrating an internal configuration of a multilayer substrate 101A and illustrating insulating protective films 31a, 32a, 31b, and 32b on conductor patterns 21a and 21b. FIG. 18 is a partial cross-sectional view illustrating an internal configuration of a multilayer substrate 101B and illustrating insulating protective films 31c, 32c, 31d, and 32d on conductor patterns 21c and 21d.

As illustrated in FIG. 17, the conductor pattern 21a includes the insulating protective film 31a on the lower surface and the insulating protective film 32a on the upper surface. The insulating protective film 31a may be provided on a portion of the lower surface of the conductor pattern 21a. Further, the insulating protective film 32b may be provided on a portion of the upper surface of the conductor pattern 21b. For example, the insulating protective film 31a overlaps a portion of the insulating protective film 32a in the stacking direction. Further, the conductor pattern 21b includes the insulating protective film 31b on the lower surface and the insulating protective film 32b on the upper surface. The insulating protective film 32b overlaps a portion of the insulating protective film 31b in the stacking direction. The conductor pattern 21a with the insulating protective films 31a and 32a and the conductor pattern 21b with the insulating protective films 31b and 32b may be in close proximity to each other. However, in the conductor pattern 21a and the conductor pattern 21b, the contact (or close proximity) between the insulating protective film 31a and the insulating protective film 32b can reduce or prevent the contact (short circuit) between the conductor pattern 21a and the conductor pattern 21b.

The insulating protective film 31a of the conductor pattern 21a and the insulating protective film 32b of the conductor pattern 21b that overlap each other in the stacking direction may be configured to at least partially overlap each other.

For example, as illustrated in FIG. 18, the insulating protective films 31c and 32c are provided on the conductor pattern 21c of the multilayer substrate 101B. Further, the insulating protective films 31d and 32d are provided on the conductor pattern 21d. The insulating protective film 31c of the conductor pattern 21c and the insulating protective film 32d of the conductor pattern 21d are provided only in the portion where the conductor pattern 21c and the conductor pattern 21 are in close proximity to each other. Even in such a case, in the conductor pattern 21c and the conductor pattern 21d, the insulating protective film 31c and the insulating protective film 32d are in contact with each other or are in close proximity to each other, so that it is possible to reduce or prevent the contact (short circuit) between the conductor pattern 21c and the conductor pattern 21d.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a plurality of insulating base materials stacked in a stacking direction;
   at least one conductor pattern on at least one of the plurality of insulating base materials, the at least one conductor pattern including two opposite major surfaces and a plurality of side surfaces; and
   insulating protective films including a first insulating protective film and a second insulating protective film; wherein
   a material of the first insulating protective film is different from a material of the second insulating protective film;
   the second insulating protective film is provided only on one of the two opposite major surfaces and the plurality of side surfaces; and
   the first insulating protective film is provided only on the other of the two opposite major surfaces.

2. The multilayer substrate according to claim 1, wherein the plurality of insulating base materials are made of a thermoplastic resin.

3. The multilayer substrate according to claim 1, wherein each of the insulating protective films is thinner than each of the at least one conductor pattern.

4. The multilayer substrate according to claim 1, wherein the at least one conductor pattern is a patterned metal foil; and
   the insulating protective films are oxide films of the metal foil.

5. The multilayer substrate according to claim 1, wherein the insulating protective films are thermosetting resins that are thermally cured at a temperature lower than a temperature at a time of thermocompression-bonding.

6. The multilayer substrate according to claim 1, wherein the insulating protective films have a lower dielectric constant than the plurality of insulating base materials.

7. The multilayer substrate according to claim 1, further comprising:
   an interlayer connection conductor that conducts to the at least one conductor pattern; wherein
   the interlayer connection conductor is directly connected with the at least one conductor pattern without the insulating protective films.

8. The multilayer substrate according to claim 1, wherein the at least one conductor pattern is a coil pattern with a winding axis in the stacking direction.

9. The multilayer substrate according to claim 1, wherein each of the first insulating protective film and the second insulating protective film is in contact with the at least one conductor pattern.

10. The multilayer substrate according to claim 1, wherein the plurality of insulating base materials are made of a same material as each other; and
   the plurality of insulating base materials are directly bonded to each other.

* * * * *